United States Patent [19]
Oh

[11] Patent Number: 5,925,188
[45] Date of Patent: Jul. 20, 1999

[54] FILM FORMING APPARATUS

[75] Inventor: Seung-Ho Oh, Nirasaki, Japan

[73] Assignee: Tokyo Electron Limited, Tokyo, Japan

[21] Appl. No.: 08/739,222

[22] Filed: Oct. 29, 1996

[30] Foreign Application Priority Data

Oct. 30, 1995  [JP]  Japan ................................. 7-305022

[51] Int. Cl.⁶ .................................................. C23C 16/00
[52] U.S. Cl. ........................................................ 118/715
[58] Field of Search ................................... 118/715, 725, 118/728, 730

[56] References Cited

U.S. PATENT DOCUMENTS

| | | | |
|---|---|---|---|
| 4,096,822 | 6/1978 | Yamawaki | 118/500 |
| 5,029,554 | 7/1991 | Miyashita | 118/715 |
| 5,252,133 | 10/1993 | Miyazaki | 118/725 |
| 5,622,566 | 4/1997 | Hosaka | 118/725 |

FOREIGN PATENT DOCUMENTS

| | | |
|---|---|---|
| 181624 | 5/1986 | European Pat. Off. . |
| 308946 | 3/1989 | European Pat. Off. . |
| 62-235728 | 10/1987 | Japan ................................. 118/730 |
| 63-181315 | 7/1988 | Japan . |
| 1-109714 | 4/1989 | Japan . |
| 1-220434 | 9/1989 | Japan . |
| 1-268020 | 10/1989 | Japan . |

Primary Examiner—Richard Bueker
Attorney, Agent, or Firm—Smith, Gambrell & Russell; Beveridge, DeGrandi, Weilacher & Young Intellectual Property Group

[57] ABSTRACT

A main gas inlet pipe is provided in the vicinity of the bottom of a reaction tube, from which main gas inlet pipe is supplied a monosilane gas and a phosphine gas. A first and a second sub-gas inlet pipes also are provided, having their extreme ends opened, the sub-gas inlet pipes being provided with gas blowout holes on the proximal end somewhat from the extreme end thereof. With this arrangement, a decreasing level of gas from the main gas inlet pipe is compensated for by the gas supplied from extreme end openings of the sub-gas inlet pipes, and a further compensated for by the gas from the gas blowout holes.

7 Claims, 7 Drawing Sheets

FILM FORMING APPARATUS

BACKGROUND OF THE INVENTION

The present invention relates to a film forming apparatus used, for example, in the manufacturing process for a semiconductor device.

In the past, in semiconductor devices, a polysilicon film has been used in a wide range of structures such as a gate electrode of a transistor. Particularly with the fineness of the device being in a deep submicron area, as in the case where an embedded electrode of a contact hall is formed, a silicon film as a highly reliable material is indispensable. In view of such a demand, at present, a study on the method for doping an impurity onto the polysilicon film needs to progress further in the future.

Incidentally, known methods for forming a polysilicon film with an impurity, for example, a phosphor (P), so far include a method for hammering phosphor into a polysilicon film by ion implantation and thereafter applying an annealing process, or a method for forming a $P_2O_5$ film on the surface of the polysilicon film using a $POCl_3$ gas and thereafter applying a diffusion process. Further, as a method making use of a HOT-WALL type reduction CVD, an in-situ method (a method for simultaneously carrying out film production and doping) is also known.

However, the method for doping phosphor into the polysilicon film by the ion implantation has a drawback in that crystals in the polysilicon are broken by the shock of the ion implantation. Further, the method using $POCl_3$ gas has a drawback in that the concentration evenness widthwise of wafers is poor and the step of shaving the $P_2O_5$ film is necessary.

On the other hand, the in-situ method is free from those drawbacks as noted above and has the merit in that the phosphor concentration in the film can be controlled by adjusting the flow rate of doping gas. Therefore, the in-situ method is widely carried out, for example, by the vertical type heat treatment apparatus.

In the case where the in-situ method is carried out using the vertical type heat treatment apparatus, when a design is made so that a film forming gas and a phosphine gas are supplied from the bottom of the reaction tube of the heat treatment apparatus to form a gas flow toward the top of the reaction tube, the phosphor is consumed and leaned as the gas flow moves upward and therefore the face-to-face (between wafers) evenness with respect to the phosphor concentration of wafers is deteriorated.

Figure 6:
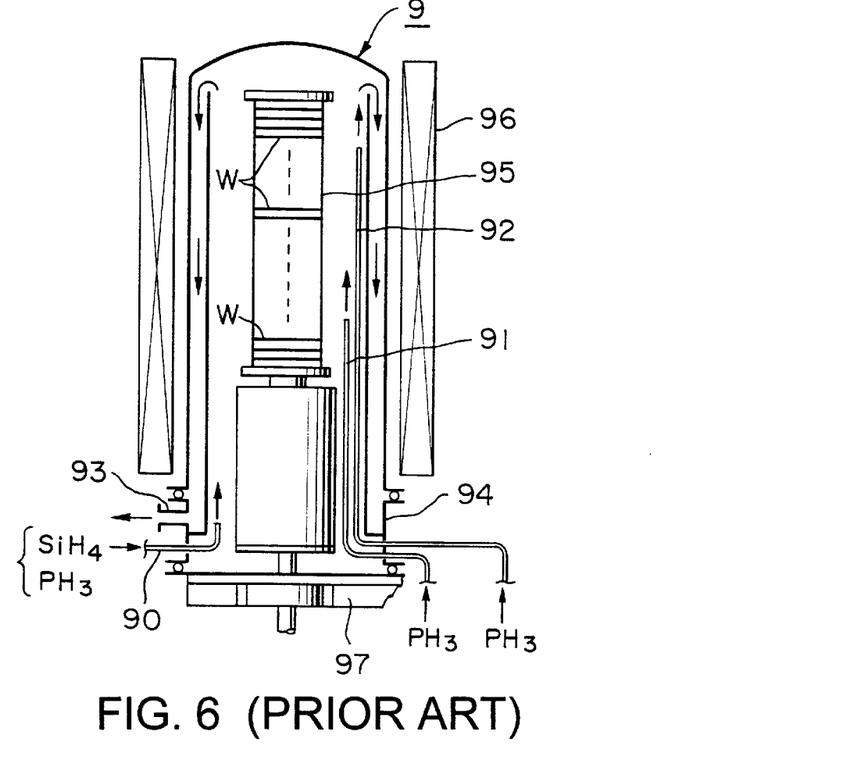
FIG. 6 is a longitudinal schematic view schematically showing a conventional film forming apparatus.

In view of the foregoing, the present inventor has studied the vertical type heat treatment apparatus having the construction shown in FIG. 6. The vertical type heat treatment apparatus shown in FIG. 6 will be briefly explained. Reference numeral 9 designates a reaction tube of a double tube construction. At the lower end of the reaction tube 9 are arranged a main gas inlet pipe 90, and a manifold 94 provided with sub-gas inlet pipes 91, 92 and an exhaust pipe 93 which are different in length from each other. First, a wafer boat 95 having a number of, for example, 100 wafers W mounted thereon is carried into the reaction tube 9 from a lower end opening thereof by a boat elevator 97 to load the wafers W into the reaction tube 9. When the wafers W are loaded, the interior of the reaction tube 9 is heated to a fixed temperature by means of a heater 96. Next, for example, a monosilane gas ($SiH_4$) gas and a phosphine ($Ph_3$) gas are diluted with, for example, nitrogen gas and supplied from the main gas inlet gas 90 into the reaction tube 9 while the exhaust pipe 93 vacuums the reaction tube 9 so that the interior of the reaction tube 9 assumes a fixed vacuum degree. At the same time, when the phosphine ($Ph_3$) gas is diluted with, for example, nitrogen gas and supplied into the reaction tube 9 from the extreme end openings of the sub-gas inlet pipes 91 and 92, a thin film is formed on the wafer surface by the gas phase reaction of the gas to be processed.

Figure 7:
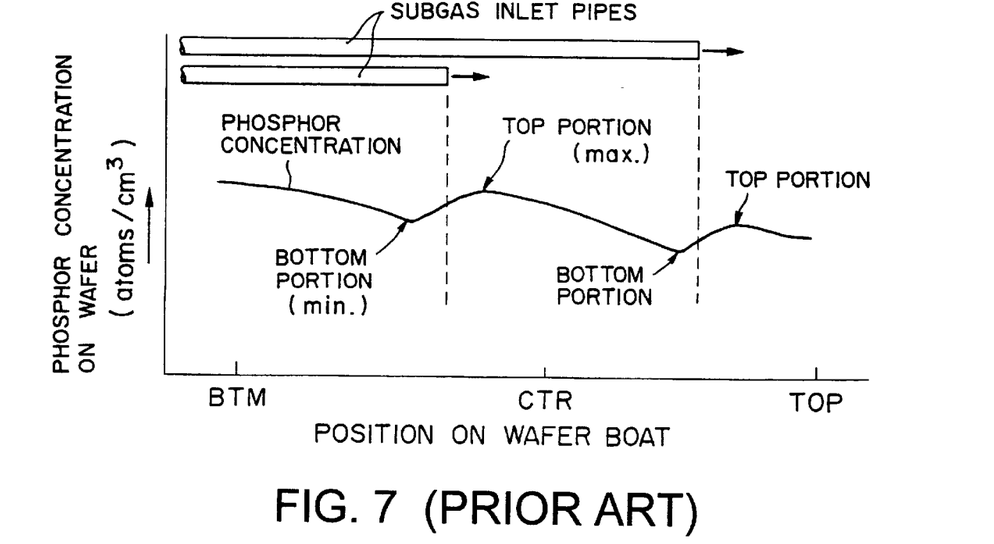
FIG. 7 is a phosphor concentration distribution curve for the conventional film forming apparatus.

According to the aforementioned heat treatment apparatus, since the phosphor for a short portion is compensated for from the sub-gas inlet pipes 91 and 92, the face-to-face evenness of phosphor concentration is enhanced as shown in FIG. 7. Since the phosphine gas flowing out of the extreme end openings of the sub-gas inlet pipes 91 and 92 is partly diffused at the rear side thereof, the bottom portion of the phosphor concentration in the graph shown in FIG. 7 is to be positioned at the lower side (upstream side) rather than the extreme ends of the sub-gas inlet pipes 91 and 92.

Further, as for another technique, there is a technique disclosed in Japanese Patent Laid-Open Publication No. 45529/1995. According to this process, the extreme end of a reaction gas inlet pipe is closed, and one or more nozzles (doping gas supply pipes) different in length from each other having a plurality of gas inject holes arranged in the midst of the reaction gas inlet pipe are provided to enhance the face-to-face evenness of phosphor concentration.

With the recent trend of higher integration of the semiconductor device and more fineness of a pattern thereof, an allowable range of quality of film is considerably narrow. In the heat treatment apparatus shown in FIG. 6, the phosphine gas is diffused out of the extreme end openings of the sub-gas inlet pipes 91 and 92, and the phosphine gas can be compensated for to a comparatively far position downstream though there is some difference depending on the gas flow rate. There is an advantage in that even if the length of the sub-gas inlet pipes 91 and 92 is set considerably roughly, high face-to-face evenness of phosphor concentration is obtained, facilitating the setting of the apparatus.

However, as will be understood from FIG. 7, it is unavoidable in this heat treatment apparatus that, in the phosphor concentration distribution curve, the top and the bottom of the curve are formed in the vicinity of the extreme end of the pipe and upstream somewhat from the extreme end of the pipe, respectively. To cope with this, one proposal is to increase the number of sub-gas inlet pipes. In this proposal, however, the wafer possibly comes in contact with the sub-gas inlet pipe to separate a formed thin film, resulting in the high probability of generation of particles and rendering the maintenance work troublesome, which is not advisable.

Further, the technique disclosed in Japanese Laid-Open Patent Publication No. 45529/1995 previously mentioned is intended to secure the face-to-face evenness of phosphor concentration by phosphine gases blown out of the plurality of holes arranged lengthwise of the nozzles. However, the pressure of the nozzle lowers near the extreme end of the nozzle, posing a problem in that the setting of a diameter of the hole and the arranging of spacing is troublesome. There is a further problem in that, when the setting of the phosphor concentration of wafers varies, the setting of the hole of the nozzle should be changed accordingly.

SUMMARY OF THE INVENTION

An object of the present invention is to provide a film forming apparatus in which, in forming a film including a dopant component, for example, such as phosphor, on a substrate to be processed such as a wafer, a high evenness of the concentration of the dopant component between the substrates to be processed is obtained.

According to the present invention, there is provided a film forming apparatus comprising: a reaction tube, a main gas supply pipe provided with an extreme end opening for supplying a film forming gas and a doping gas into said reaction tube from one end side of said reaction tube, and a sub-gas supply pipe having an extreme end positioned at the other end side of said reaction tube rather than the extreme end opening of said main gas supply pipe and opening toward said other end side to supply the doping gas from said extreme end opening, wherein at least one gas blowout hole is provided in the side of said sub-gas supply pipe, and the doping gas is supplied from said extreme end opening and said gas blowout hole of said sub-gas supply pipe so as to compensate for a short portion of the doping gas supplied from said main gas supply pipe.

DETAILED DESCRIPTION OF THE PREFERRED EMBODIMENTS

Figure 1:
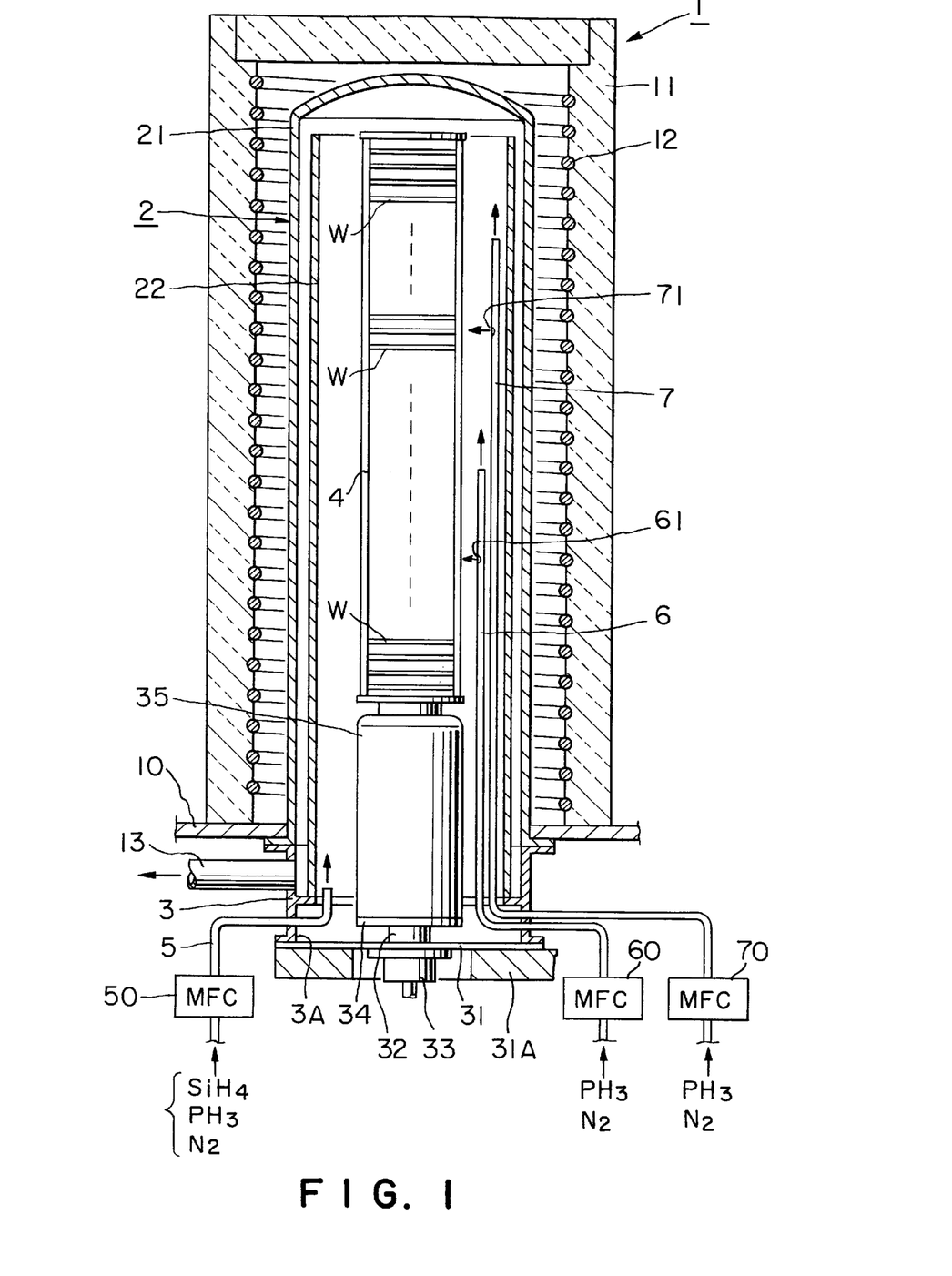
FIG. 1 is a longitudinal sectional view showing the entire construction of a film forming apparatus according to the present invention.

FIG. 1 is a longitudinal sectional view showing one example of a film forming apparatus according to the present invention. A heating furnace 1 is installed on a base plate 10, and a heater 12 is provided in an inner peripheral surface of a heat insulating layer 11 so as to surround a reaction tube 2.

Inside of the heating furnace 1 is provided a reaction tube 2 of a dual pipe construction for forming an atmosphere to be processed therein, comprising an outer tube 21 having a closed upper end formed, for example, of quartz, and an inner tube 22 formed, for example, of quartz, arranged coaxially with the outer tube 21.

The outer tube 21 and the inner tube 22 are held at their lower end by a tubular manifold 3 formed of stainless steel or the like. At an opening 3A on the lower end of the manifold 3 is closeably provided a cap portion 31 for hermetically sealing the opening 3A.

A rotational shaft 32, which is rotable in a hermetical state, for example, by a magnetic seal, is inserted into the center of the cap portion 31, the rotational shaft 32 having a lower end connected to a rotational mechanism 33 of a lift bed 31A and an upper end secured to a turn-table 34. Upwardly of the turn-table 34 is mounted a wafer boat 4 made of quartz which is a holder for substrate to be processed through a heat retaining tube 35. The wafer boat 4 has, for example, four columns each having a groove so that for example, 170 semiconductor wafers W are stacked in a fixed vertical spaced relation and can be held in the grooves of the columns.

On the lower side of the manifold 3, a main gas inlet pipe 5 for mixing a film forming gas, for example, a monosilane ($SiH_4$) gas, and a doping gas, for example, a phosphine ($PH_3$) gas, with a carrier gas such as a nitrogen gas to introduce the mixture into the reaction tube 2 is inserted laterally, the main gas inlet pipe 5 being bent into an L-shape and extending into the reaction tube 2 axially and upwardly. The main gas inlet pipe 5 is connected to a gas supply source (not shown) through a mass flow controller (MFC) 50.

Further, on the lower side of the manifold 3, a first sub-gas inlet pipe 6 and a second sub-gas inlet pipe 7 for mixing a doping gas, for example, a phosphine ($PH_3$) gas with a carrier gas such as a nitrogen gas, to introduce the mixture into the reaction tube 2 are inserted laterally, the sub-gas inlet pipes 6 and 7 being bent into an L-shape and extending axially and upwardly of the reaction tube 2. The sub-gas inlet pipes 6 and 7 are connected to a gas supply source (not shown) through mass flow controllers (MFC) 60 and 70, respectively.

An extreme-end opening (a gas supply opening) of the main gas inlet pipe 5 is positioned in the vicinity of the bottom of the heat retaining tube 35. Supposing that the wafer boat 4 is constituted so as to be able to receive, for example, 170 wafers therein, the first and second sub-gas inlet pipes 6 and 7 are positioned such that the extreme end of the first sub-gas inlet pipe 6 is, for example, slightly lower than the center of a wafer holding area (i.e., in terms of the stage numbers of the grooves of the wafer boat 4, in the vicinity of the 100th stage from the top) while the extreme end of the second sub-gas inlet pipe 7 is positioned, for example, slightly lower than the top of a wafer holding area (i.e., in the vicinity of the 30th stage from the top).

Figure 2:
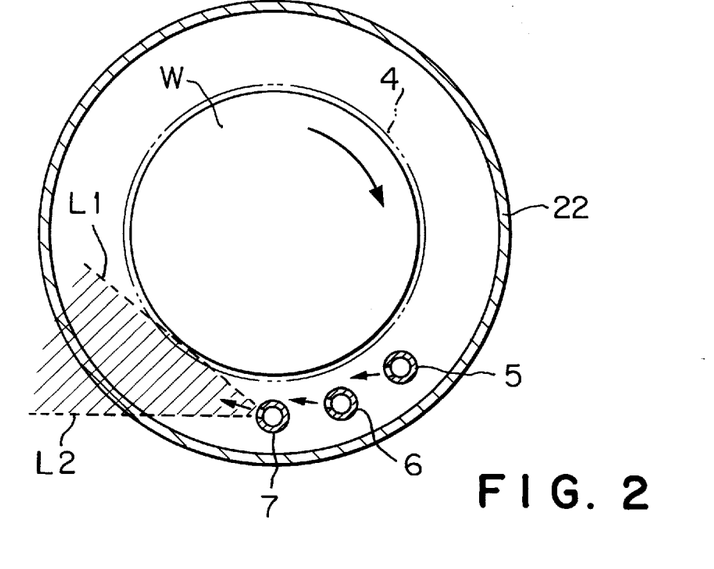
FIG. 2 is a cross-sectional plan view showing a plane positional relationship between a main gas pipe and a sub-gas inlet pipe used in the film forming apparatus according to the present invention.
Figure 3A:
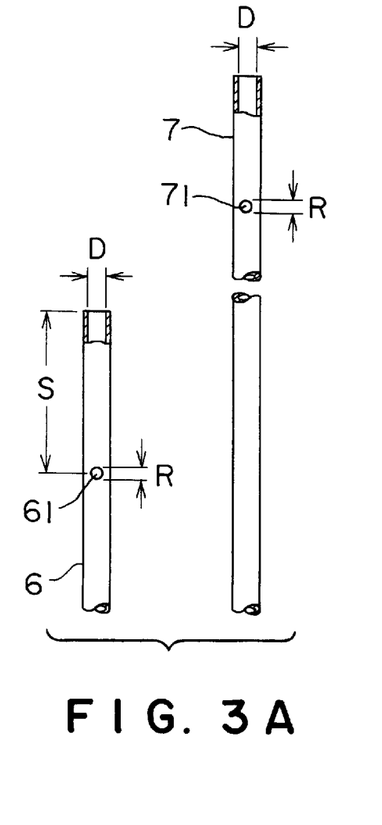
FIG. 3A is an explanatory view of the first and second sub-gas inlet pipes.

The main gas inlet pipe 5, and the sub-gas inlet pipes 6 and 7 are arranged with the base distance from each other, for example, about 55 mm in the peripheral direction around the wafer boat 4, as shown in FIG. 2, and are formed from quartz pipes whose inner diameter D is, for example, 4.5 mm, as shown in FIG. 3A.

The extreme ends of the first and second sub-gas inlet pipes 6 and 7 are opened. For compensating for a portion (amount) that cannot be compensated for evenness of a flow of phosphine gas merely by the outflow from the extreme end openings, gas blowout holes 61 and 71, having diameter R which is, for example, 0.5 to 1 mm, are bored on the proximal side (lower side) slightly from the extreme end opening, that is, on the proximal side, for example, about scores of mm (about 5 to 20 stages in terms of the stage numbers of wafers) by the distance S from the extreme end in FIG. 3A. However, the length of the first and second sub-gas inlet pipes 6 and 7 and the position of the gas blowout holes 61 and 71 are properly determined according to the value of the phosphor concentration on the wafers W as expected, and the value is not limited to the aforementioned value.

Figure 3B:
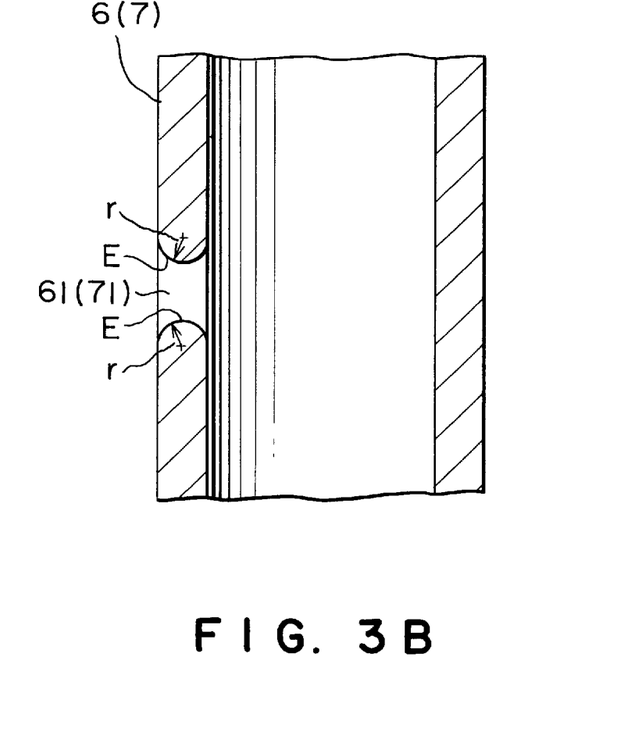
FIG. 3B is an enlarged longitudinal sectional view of blowout holes of the sub-gas inlet pipes.

The direction of the gas blowout holes 61 and 71 is preferably of a radial diagonal area between a line L1 in a direction of 45 degrees and a line L2 in a direction of 90 degrees opposite to the rotational direction of the wafers W, rather than a line toward the center of the wafers W, as shown in FIG. 2, in order to eliminate the in-plane unevenness. As shown in FIG. 3B, The edge portion E of the gas blowout holes 61 and 71 is preferably rounded at an r-part. This brings forth the merit that, even if the reacted product adheres to the edge portion E, a formed film is hard to separate from the edge portion.

On the other hand, to the upper side of the manifold 3 is connected an exhaust pipe 13 connected to a vacuum pump (not shown) in order that processed gas is discharged from a clearance between the outer tube 21 and the inner tube 22 to set the interior of the reaction tube 2 to a fixed pressure, as shown in FIG. 1.

In the film forming apparatus according to the present invention as described above, first, the atmosphere to be processed within the reaction tube 2 is reheated by the heater 12 so that the temperature of the center portion (the vertical central portion) for the wafer boat 4 is set. Then, the wafer boat 3 having 170 wafers W vertically received thereon at a pitch of, for example, 4.76 mm, is loaded into the reaction tube 2 from the lower opening 3A by the lift bed 31A.

Next, after the interior of the reaction tube 2 is vacuumed to a fixed vacuum degree, for example, 1×10-3 Torr, a monosilane gas as a film forming gas and a phosphine gas as a doping gas are diluted with a carrier gas, for example, nitrogen ($N_2$) gas, and introduced into the inner tube 22 from the main gas inlet pipe 5 at the flow rate of, for example, 500 cc/min, 450 cc/min and 100 cc/min, respectively. At the same time, the flow rate of phosphine gas is set to, for example, 2.5 cc/min, and the gas diluted to 1% with nitrogen gas is introduced into the reaction tube 2 from the first and second sub-gas inlet pipes 6 and 7, and the reaction tube 2 is exhausted so as to have a pressure of, for example, 0.5 Torr to form a film on the wafer W while rotating the wafer boat 4 at, for example 1 to 3 r.p.m. Gas for diluting a monosilane gas and a phosphine gas is not limited to $N_2$ gas, and other inert gases such as helium (He) may be used.

After the film forming process has been performed as described above, wafers are heated, for example, by a separate heat treatment apparatus, to 900° C. in an atmosphere of nitrogen ($N_2$) gas, and the wafers for the film forming process are subjected to an annealing process to form a phosphor-diffused polysilicon thin film.

According to the embodiment of the present invention as described above, the monosilane gas and the phosphine gas flow out upward through the main gas inlet pipe 5 from the neighborhood of the bottom of the reaction tube 2. The monosilane gas becomes thermally cracked and a polysilicon film forms on the surface of the wafer W. The phosphine gas also becomes cracked and phosphor moves into the polysilicon film whereby a phosphor-contained polysilicon film is formed on the wafer. Since the phosphine gas is consumed as it moves up within the reaction tube 2, the flow rate of the phosphine gas becomes short. However, such a short flow rate is sufficiently compensated for by the phosphine gas being supplied through the extreme end opening of the first sub-gas inlet pipe 6 from the neighborhood of the center of the wafer boat 4.

The flow rate of the phosphine gas flowing out of the first sub-gas inlet pipe 6 becomes short as it moves upward of the reaction tube 2. However, phosphine gas is supplied through the extreme end opening of the second sub-gas inlet pipe 7 from the top whereby the short flow rate of the phosphine gas from the first sub-gas inlet pipe 6 is compensated for.

Figure 4:
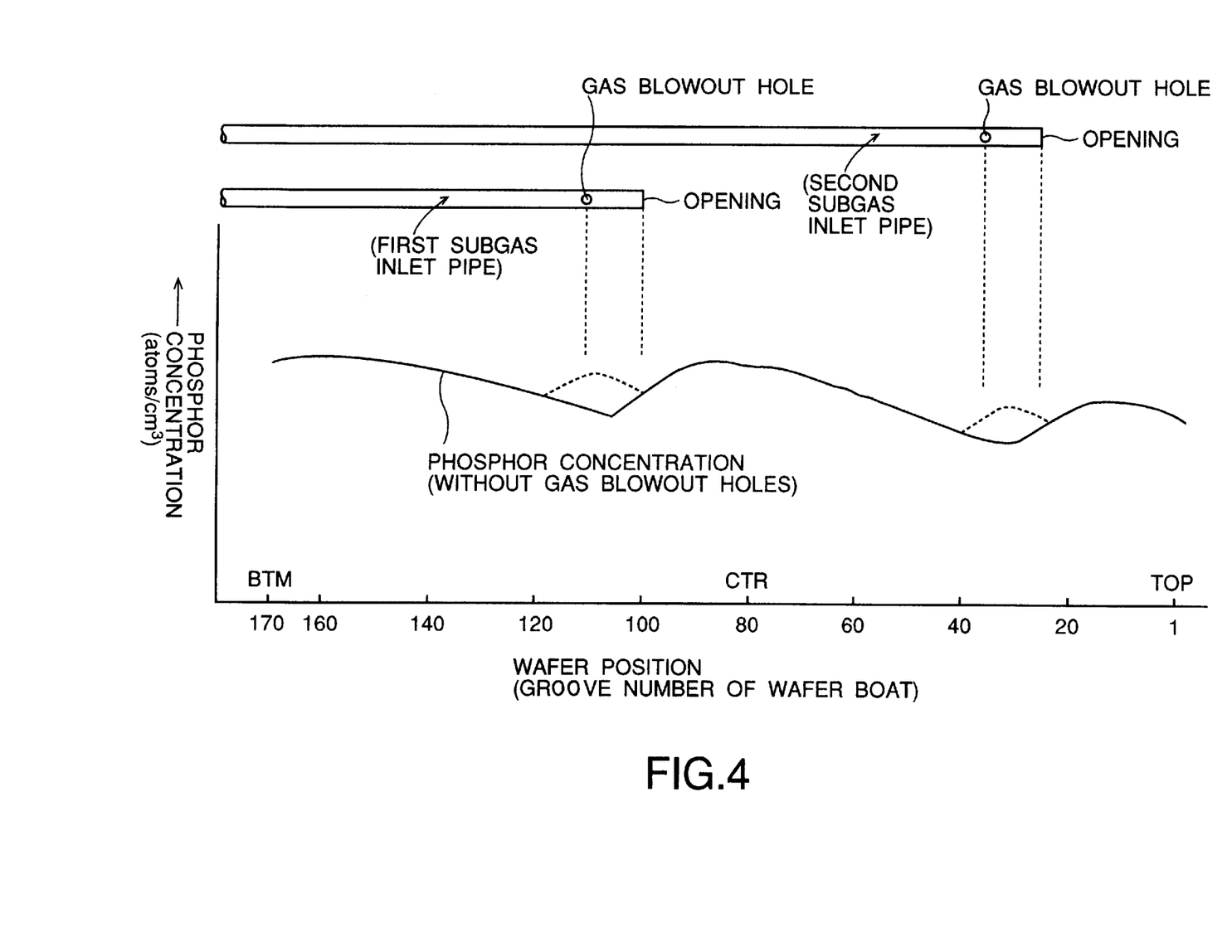
FIG. 4 is a phosphor concentration distribution curve showing a relationship between a wafer mounting position on a wafer boat and a phosphor concentration.

The solid line of FIG. 4 indicates the characteristic curve showing the phosphor concentration of wafers in which the sub-gas inlet pipe is not provided with a gas blowout hole, representing the trend of the phosphor concentration distribution relative to the wafer position. The bottom portion (BTM) of the concentration distribution characteristic is positioned on the proximal end side (lower side) somewhat from the extreme end of the sub-gas inlet pipes 6 and 7 because the phosphine gas blown out of the extreme end openings of the sub-gas inlet pipes 6 and 7 is also somewhat diffused toward the proximal end side. The phosphor concentration as expected is sometimes a high concentration in excess of $2 \times 10^{20}$ atoms/cm$^3$ and sometimes a low concentration of approximately 0.8 to $2 \times 10^{20}$ atoms/cm$^3$. In the case of providing particularly the low concentration, the flow rate of the phosphine gas is so small as to not reach the end. Therefore, a difference between the top (TOP) and the bottom (BTM) of the concentration distribution curve becomes large.

Therefore, the gas blowout holes 61 and 71 are provided in the sub-gas inlet pipes 6 and 7 so as to compensate for the low level of phosphine gas corresponding to the bottom portion of the concentration distribution curve, so that a small amount of phosphine gas flows out therefrom. Then, the phosphine gas in the vicinity of the gas blowout holes 61 and 71 increases, whereby the phosphor concentration becomes high. Referring to the concentration curve of FIG. 4, the bottom portion indicated by the solid line is raised as indicated by the dotted lines, because of which the evenness of the phosphor concentration between the wafers is enhanced. This results in that the decreasing level of the phosphine gas from the main gas inlet pipe 5 is compensated for by supplying the phosphine gas from the extreme end openings of the sub-gas inlet pipes 6 and 7, whereby the lower levels that cannot be compensated for are further compensated for by a small amount of phosphine gas from the gas blowout holes 61 and 71.

The lengthwise position of the gas blowout holes 61 and 71 may be appropriately set according to the phosphor concentration as expected. In the case where the phosphine gas flows out upwardly from the extreme end openings of the sub-gas inlet pipes 6 and 7, the trend of the concentration distribution curve as described above can be expected. Moreover, this is a compensation further to a compensation to some extent by the phosphine gas from the extreme ends of the sub-gas inlet pipes 6 and 7, and therefore, high precision for the setting of the position of the gas blowout holes 61 and 71 is not demanded. Accordingly, the setting of the heat treatment apparatus is easy.

There is known a further procedure in which a single gas inlet pipe is used to cause a monosilane gas and a phosphine gas to flow, and the flow rate of the monosilane gas is set to a large flow rate, for example, 1000 to 2000 cc/min to carry phosphor to the extreme end. In the present invention, however, it is sufficient for the flow rate of monosilane gas to be small as compared with the aforementioned procedure. Since monosilane gas is processed by burning, the cost of processing exhaust of monosilane gas will correspondingly be low.

In the foregoing, the main gas inlet pipe according to the present invention is included not only in the case where the monosilane gas and the doping gas are supplied by a common gas inlet pipe but also in the case where the monosilane gas and the doping gas are separately supplied from, for example, two gas inlet pipes. In this case, the main gas inlet pipe is composed of two gas inlet pipes. the sub-gas inlet pipe may be one or three, but it is preferred that two sub-gas inlet pipes are used as in the aforementioned embodiment in consideration of the merits that less possible contamination of particles occurs and the maintenance is easy while securing high in-plane evenness with respect to the phosphor concentration.

Further, the number of gas blowout holes bored in the sub-gas inlet pipe may be more than two. Furthermore, for example, two sub-gas inlet pipes may be used, a dual pipe comprising an inner pipe and an outer pipe in which the inner pipe is made longer than the outer pipe, the outer pipe is used as a first sub-gas inlet pipe and the inner pipe is used as a second sub-gas inlet pipe. Further, the film forming gas, for example, may be supplied along with the doping gas from the sub-gas inlet pipe.

In producing a phosphor doped silicon film, a disilane ($Si_2H_6$)gas may be used as the film forming gas. In the present invention, a dopant component subjected to doping during the production of a film is not limited to phosphor but can be also applied, for example, to the case where a $B_2H_6$ gas is supplied to dope and the case where an $A_5H_3$ gas is use to dope. The present invention may be applied to a transverse heat treatment apparatus, and is not limited to a vertical heat treatment apparatus.

The relationship between the mounting position of wafers on the wafer boat and the phosphor concentration in the film forming apparatus of the present invention and the conventional film forming apparatus will now be taken into consideration.

Figure 5A:
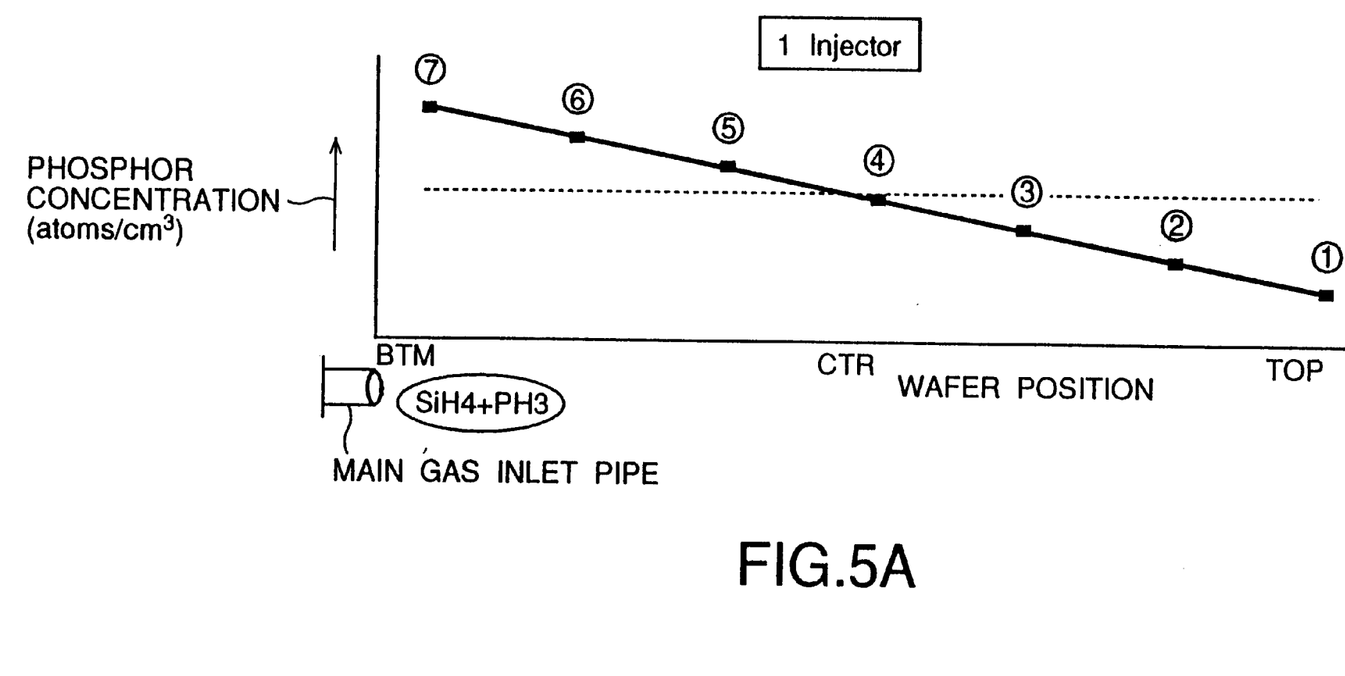
FIGS. 5A, 5B and 5C are phosphor concentration distribution curves showing a relationship between a wafer mounting position on a wafer boat and a phosphor concentration, in the case where only the main gas inlet pipe is provided, in the case where the main gas inlet pipe, the first sub-gas inlet pipe and the second sub-gas inlet pipe are provided, and in the case where the main gas inlet pipe, the first sub-gas inlet pipe (with a blowout hole), and the second sub-gas inlet pipe (with a blowout hole) are provided (the present invention), respectively.

As shown in FIG. 5A, in the case where a projecting main gas inlet pipe is provided on a reaction tube, the phosphor concentration lowers from the bottom (BTM) toward the center (CTR) of the reaction tube ($\hat{7} \rightarrow \hat{4}$), and is lowest at the top (TOP) ($\hat{1}$), preventing maintenance of evenness of the phosphor concentration between wafer surfaces.

Figure 5B:
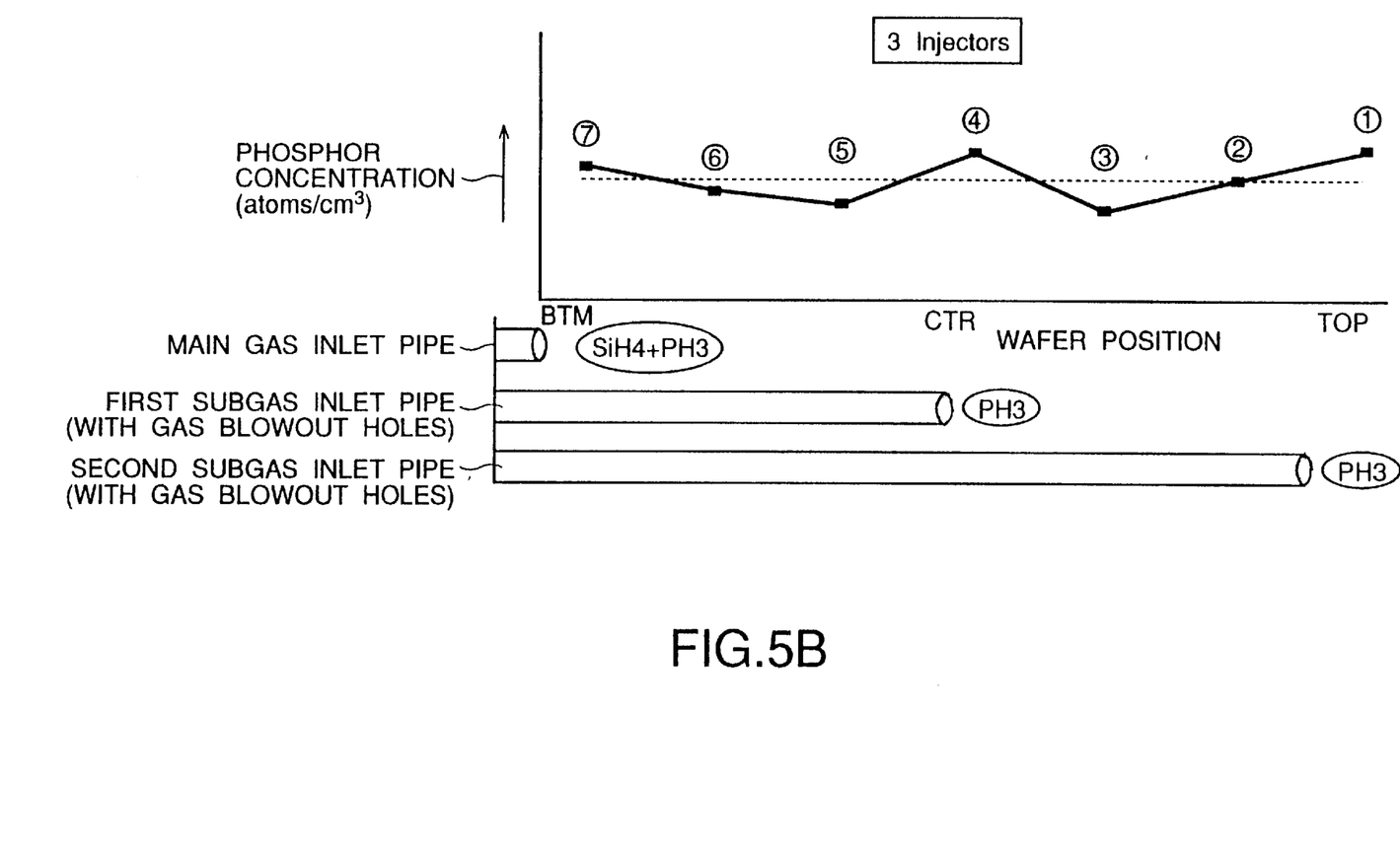

As shown in FIG. 5B, in the case where a first sub-gas inlet pipe and a second sub-gas inlet pipe which are different in length are provided in addition to the main gas inlet pipe, and a film forming gas or the like is introduced from the extreme end openings thereof into the reaction tube, the top of the phosphor concentration is formed at the extreme end opening of the first sub-gas inlet pipe while the bottom thereof is formed downstream and upstream in the vicinity of the extreme end opening thereof, likewise failing to maintain the evenness of the phosphor concentration between the wafers.

Figure 5C:
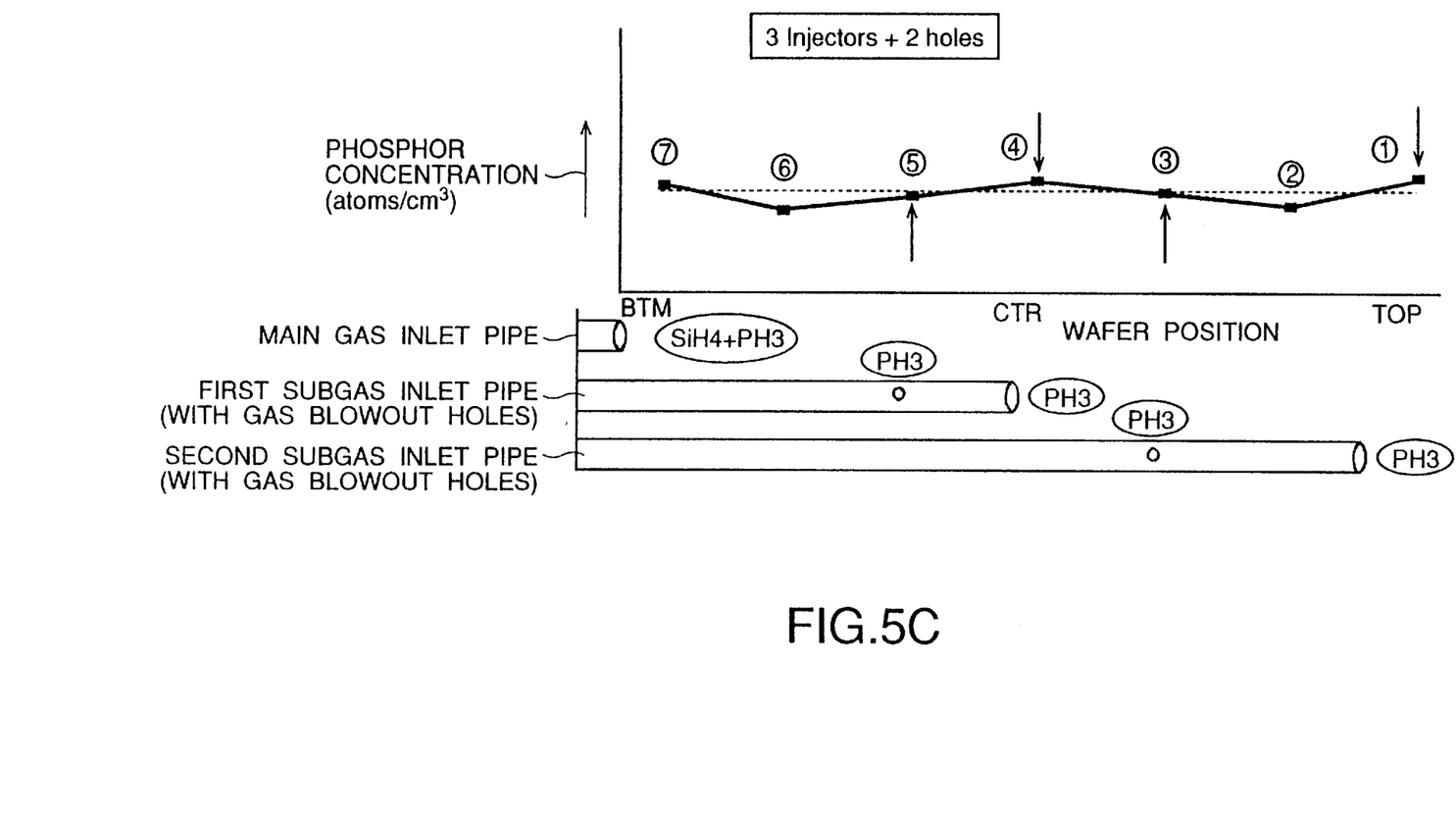

On the other hand, as shown in FIG. 5C, in the case where a first sub-gas inlet pipe (with a blowout hole) and a second sub-gas inlet pipe (with a blowout hole) are provided in addition to the main gas inlet pipe, as in the film forming apparatus according to the present invention, the top is somewhat formed at the extreme end opening of the gas inlet pipe but a nearly even face-to-face evenness of phosphor concentration is obtained.

Accordingly, with the present invention, high evenness is obtained with respect to the concentration of a dopant component between substrates to be processed, thus enhancing the yield.

What is claimed is:

1. A film forming apparatus, comprising:

a reaction tube, a main gas supply pipe having an opening at an extreme end for supplying a film forming gas and a doping gas into a first end of the reaction tube, and a sub-gas supply pipe having an extreme end positioned at a second end of the reaction tube opposite the first end, the sub-gas supply pipe having an opening at the extreme end for supplying the doping gas to the second end of the reaction tube, and defining at least one gas blowout hole in a side wall of the sub-gas supply pipe such that the at least one gas blowout hole has rounded edges.

2. The film forming apparatus according to claim 1, wherein a plurality of sub-gas supply pipes of different lengths are provided, each of the plurality of sub-gas supply pipes defining at least one gas blowout hole in a side wall of the sub-gas supply pipe such that the at least one gas blowout hole has rounded edges.

3. The film forming apparatus according to claim 2, wherein each of the sub-gas supply pipes have a same inside diameter.

4. The film forming apparatus according to claim 2, wherein each of the sub-gas supply pipes have a different inside diameter.

5. The film forming apparatus according to claim 2, wherein the at least one blowout holes have apertures of a same size.

6. The film forming apparatus according to claim 2, wherein the at least one blowout holes have different size apertures.

7. The film forming apparatus according to claim 1, wherein said main gas supply pipe is composed of two gas inlet pipes to supply separately the film forming gas and the doping gas into said reaction tube.

* * * * *